United States Patent
Ko et al.

(10) Patent No.: US 12,431,212 B2
(45) Date of Patent: Sep. 30, 2025

(54) ROW DECODER CIRCUIT, MEMORY DEVICE AND MEMORY SYSTEM

(71) Applicant: SAMSUNG ELECTRONICS CO., LTD., Suwon-si (KR)

(72) Inventors: Junyoung Ko, Suwon-si (KR); Jungmin Bak, Suwon-si (KR); Changhwi Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 155 days.

(21) Appl. No.: 18/133,319

(22) Filed: Apr. 11, 2023

(65) Prior Publication Data
US 2023/0395180 A1    Dec. 7, 2023

(30) Foreign Application Priority Data

Jun. 3, 2022 (KR) .................. 10-2022-0068332
Sep. 28, 2022 (KR) .................. 10-2022-0123167

(51) Int. Cl.
*G11C 29/50* (2006.01)
*G11C 11/408* (2006.01)

(52) U.S. Cl.
CPC .... *G11C 29/50004* (2013.01); *G11C 11/4085* (2013.01); *G11C 11/4087* (2013.01)

(58) Field of Classification Search
CPC ............ G11C 11/4085; G11C 11/4087; G11C 29/50004

(Continued)

(56) References Cited

U.S. PATENT DOCUMENTS 7,035,131 B2    4/2006  Huang et al.
7,532,513 B2    5/2009  Chen et al.
(Continued)

FOREIGN PATENT DOCUMENTS

KR    10-2013-0140601 A    12/2013
WO    2012/006160 A1    1/2012

*Primary Examiner* — Sung Il Cho
(74) *Attorney, Agent, or Firm* — Sughrue Mion, PLLC

(57) ABSTRACT

A row decoder circuit includes a first transistor connected to a power supply node and a first node; a plurality of second nodes connected in parallel between the first node and a power ground node, each of the plurality of second nodes being connected to a corresponding word line among the plurality of word lines; a plurality of second transistors connected between the first node and the plurality of second nodes; a plurality of third transistors connected between the plurality of second nodes and a power ground node; a comparator outputting a detection signal by receiving a voltage of the first node and a reference voltage. In a pre-charging period, the first transistor is turned on, the plurality of second transistors are turned on, and the third transistors are turned off, so that the first node and the plurality of second nodes are charged. In a development period, the first transistor maintains a turned-on state, the plurality of second transistors are turned off, and each of the second nodes is discharged at a different rate depending on whether current of the corresponding word line is leaked, and in a sensing period, the first transistor is turned off, the plurality of second transistors are turned on, and the first node is selectively discharged according to voltage levels of the discharged second nodes.

20 Claims, 14 Drawing Sheets

(58) Field of Classification Search
USPC .................................................. 365/230.06
See application file for complete search history.

(56) References Cited

U.S. PATENT DOCUMENTS

| | | | |
|---|---|---|---|
| 7,626,883 B2 | 12/2009 | Shimano et al. | |
| 8,432,732 B2 | 4/2013 | Li et al. | |
| 2011/0188326 A1* | 8/2011 | Lee ......................... | G11C 7/12 |
| | | | 365/189.11 |
| 2011/0194360 A1* | 8/2011 | Yamada ................ | G11C 29/02 |
| | | | 365/201 |
| 2012/0033522 A1* | 2/2012 | Chuang ................... | G11C 8/08 |
| | | | 365/230.06 |
| 2012/0127797 A1 | 5/2012 | Huang et al. | |
| 2012/0188816 A1* | 7/2012 | Kim .................... | G11C 11/1659 |
| | | | 365/194 |
| 2016/0233866 A1* | 8/2016 | Ishizu ................ | H03K 19/0008 |
| 2021/0090651 A1* | 3/2021 | Kim .................. | G11C 13/0028 |
| 2022/0319585 A1* | 10/2022 | Chen .................... | G11C 11/418 |

\* cited by examiner

ROW DECODER CIRCUIT, MEMORY DEVICE AND MEMORY SYSTEM

CROSS-REFERENCE TO RELATED APPLICATION

This application claims priority to Korean Patent Application No. 10-2022-0068332, filed on Jun. 3, 2022, and Korean Patent Application No. 10-2022-0123167, filed on Sep. 28, 2022, in the Korean Intellectual Property Office, the disclosures of which are incorporated by reference herein in their entireties.

BACKGROUND

1. Field

The present disclosure relates to a row decoder circuit, and a memory device and a memory system including the same.

2. Description of Related Art

A dynamic memory device, such as dynamic random access memory (DRAM), stores data in the form of an electrical charge. The memory device may include memory cells for storing data, word lines for driving the memory cells, and bit lines for inputting and outputting data to and from the memory cells.

A defect may occur in word lines due to a problem in a manufacturing process of the memory device, and a leakage current may occur in the defective word line. The leakage current may increase standby power of the memory device, and cause malfunctioning of the memory device.

SUMMARY

One or more embodiments provide a row decoder circuit capable of quickly performing a defect test on a plurality of word lines included in a memory device.

Further, one or more embodiments provide a memory device capable of rapidly detecting a defective word line from a plurality of word lines.

Further still, one or more embodiments provide a memory system capable of detecting a defective word line in a product in a finished state and repairing the defective word line.

According to an aspect of an example embodiment, a row decoder circuit controlling a plurality of word lines, includes: a power supply node; a first node; a first transistor connected to the power supply node and the first node; a plurality of second nodes connected in parallel between the first node and a power ground node, each of the plurality of second nodes being connected to a respective corresponding word line among the plurality of word lines; a plurality of second transistors connected between the first node and the plurality of second nodes; a plurality of third transistors connected between the plurality of second nodes and the power ground node; a comparator configured to output a detection signal based on a first voltage of the first node and a reference voltage, wherein, in a pre-charging period, the first transistor is turned on, the plurality of second transistors are turned on, and the plurality of third transistors are turned off, so that the first node and the plurality of second nodes are charged, in a development period, the first transistor maintains a turned-on state, the plurality of second transistors are turned off, and each of the plurality of second nodes is discharged at a different rate depending on whether a current of a first respective corresponding word line is leaked, and in a sensing period, the first transistor is turned off, the plurality of second transistors are turned on, and the first node is selectively discharged according to a second voltage level of the plurality of second nodes connected in parallel.

According to an aspect of an example embodiment a memory device includes: a memory cell array including a plurality of memory cells; a plurality of word lines connected to the memory cell array; a row decoder including a switch circuit between a power supply node and a first node, and a plurality of word line drivers connected in parallel between the first node and a power ground node and configured to drive the plurality of word lines; and a control circuit configured to perform a defect test on at least one selected word line, by pre-charging the at least one selected word line among the plurality of word lines and turning off at least one selected word line driver corresponding to the at least one selected word line to float the at least one selected word line, and turning on the at least one selected word line driver and determining whether the first node is discharged, wherein the control circuit is further configured to detect a defective word line by repeatedly performing the defect test while changing a range of the at least one selected word line among the plurality of word lines.

According to an aspect of an example embodiment, a memory system includes: a plurality of memory devices including a plurality of main word lines and a redundancy word line, the plurality of memory devices being configured to perform a defect test on at least one selected word line by pre-charging the at least one selected word line among the plurality of main word lines and turning off at least one selected word line driver corresponding to the at least one selected word line to float the at least one selected word line, and determine whether there is a discharged selected word line among the at least one selected word line; and a controller configured to control the plurality of memory devices to perform the defect test based on a command signal from a host, and output an address of a defective word line to the host based on a result of the defect test.

BRIEF DESCRIPTION OF DRAWINGS

The above and other aspects, features, and advantages will be more clearly understood from the following detailed description taken in conjunction with the accompanying drawings, in which.

DETAILED DESCRIPTION

Figure 1:
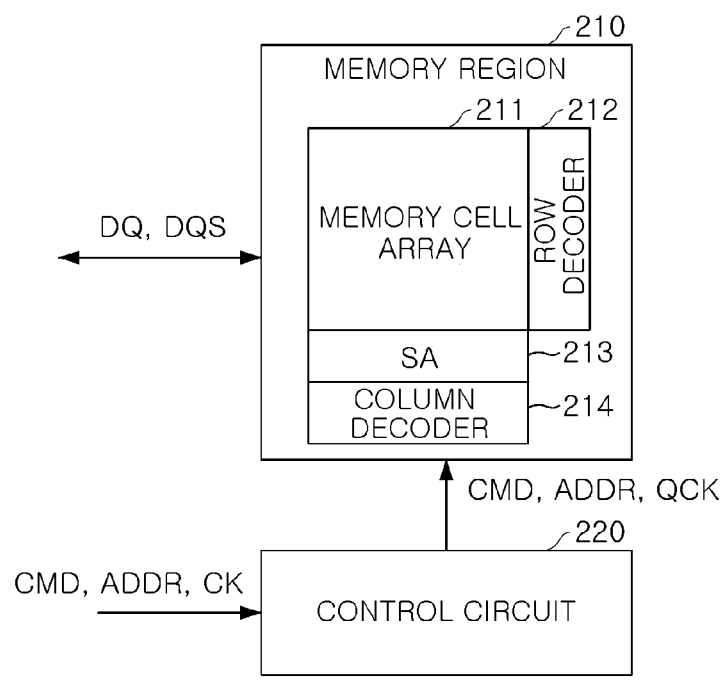
FIGS. 1 and 2 are diagrams illustrating a structure of a memory device.

Hereinafter, example embodiments will be described with reference to the accompanying drawings. Terms such as 'an upper side, 'an upper portion', 'an upper surface', a lower side, a lower portion, a lower surface, and the like, may be understood as referring to the drawings, except where otherwise indicated by reference numerals.

Figure 2:
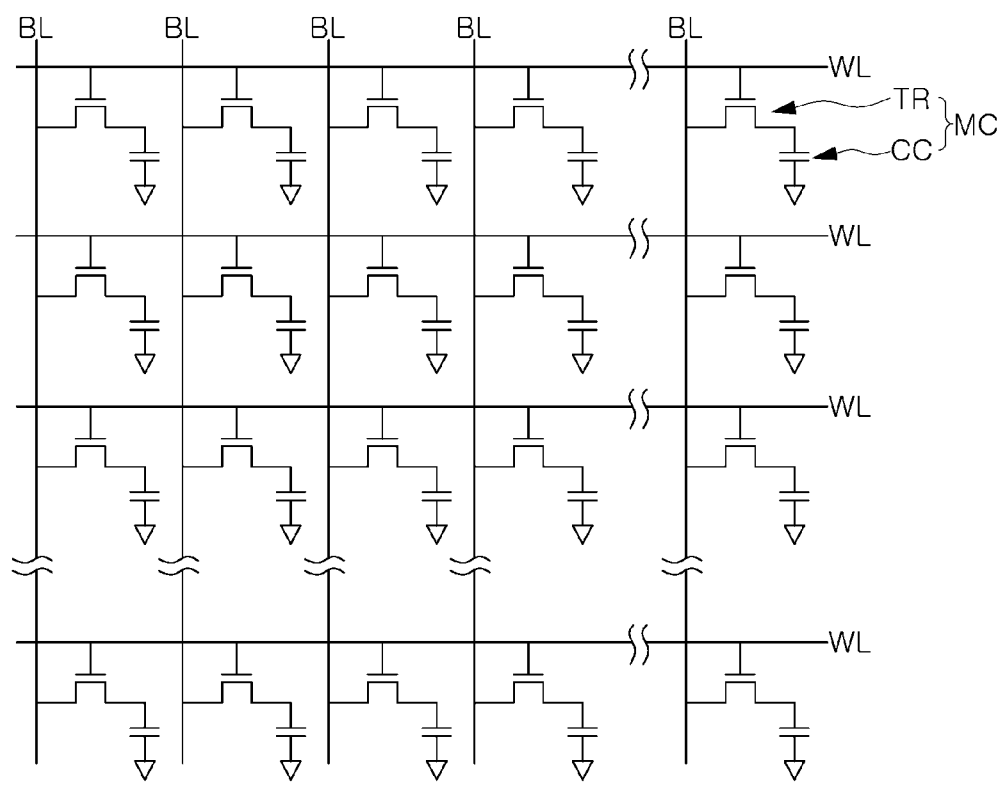

FIGS. 1 and 2 are diagrams illustrating a structure of a memory device.

Referring to FIG. 1, a memory device 200 may include a memory region 210 and a control circuit 220.

The memory region 210 may include a memory cell array 211, a row decoder 212, a sense amplifier 213, and a column decoder 214. The control circuit 220 may control an overall operation of the memory cell array 211, the row decoder 212, the sense amplifier 213, and the column decoder 214.

The control circuit 220 may buffer a command CMD, an address ADDR, and a clock signal CK provided from an external device. The control circuit 220 may provide the buffered command CMD and the address ADDR to the memory region 210, and provide the buffered clock signal CK to the memory region 210 as an output clock signal QCK for controlling an operation of the memory region 210.

Referring to FIG. 2, the memory cell array 211 may include a plurality of memory cells MC connected to a plurality of bit lines BL and a plurality of word lines WL. When the semiconductor device 200 is a volatile memory such as a dynamic random access memory (DRAM), each of the plurality of memory cells MC may include a cell switch TR and a cell capacitor CC.

The semiconductor device 200 may store data in each of the plurality of memory cells MC by turning-on the cell switch TR, and charging or discharging the cell capacitor CC, and read data stored in each of the plurality of memory cells MC by turning-on the cell switch TR and measuring a voltage of the cell capacitor CC.

According to the implementation, the plurality of word lines WL may include main word lines and a redundancy word line. When a defective word line is detected among the main word lines, the redundancy word line may replace the defective word line.

Referring back to FIG. 1, the memory cell array 211 may be connected to the row decoder 212 through word lines, and may be connected to the sense amplifier 213 through bit lines.

The row decoder 212 may select one of the plurality of word lines WL in response to a row address X-ADDR. For example, the row decoder 212 may turn-on a selected word line for a write operation and a read operation.

The sense amplifier 213 may operate as a write driver or a sense amplifier according to an operation mode. For example, during a write operation, the sense amplifier 213 may apply a bit line voltage corresponding to data to be written to a selected bit line. During a read operation, the sense amplifier 213 may sense data stored in the memory cell by amplifying a current or voltage of the selected bit line. The column decoder 214 may control the sense amplifier 213 in response to a column address Y-ADDR.

A defect may occur in the word lines WL due to a problem in a manufacturing process of the memory device 200, and a leakage current may occur in the defective word line. The leakage current may increase standby power of the memory device 200 and cause malfunctioning of the memory device.

If a defective word line of the memory device 200 can be detected, a repair such as replacing the defective word line with a redundancy word line is performed, so that the memory device 200 can be used normally.

According to the trend of high capacitance of the memory device 200, the memory device 200 may include a plurality of word lines WL, for example, thousands of word lines WL. If a defective word line needs to be detected by sequentially detecting whether a leakage current has occurred in each of the plurality of word lines WL, a time for detecting the defective word line may increase. Accordingly, it is necessary to be able to quickly perform a defect test on a plurality of word lines WL.

Figure 3:
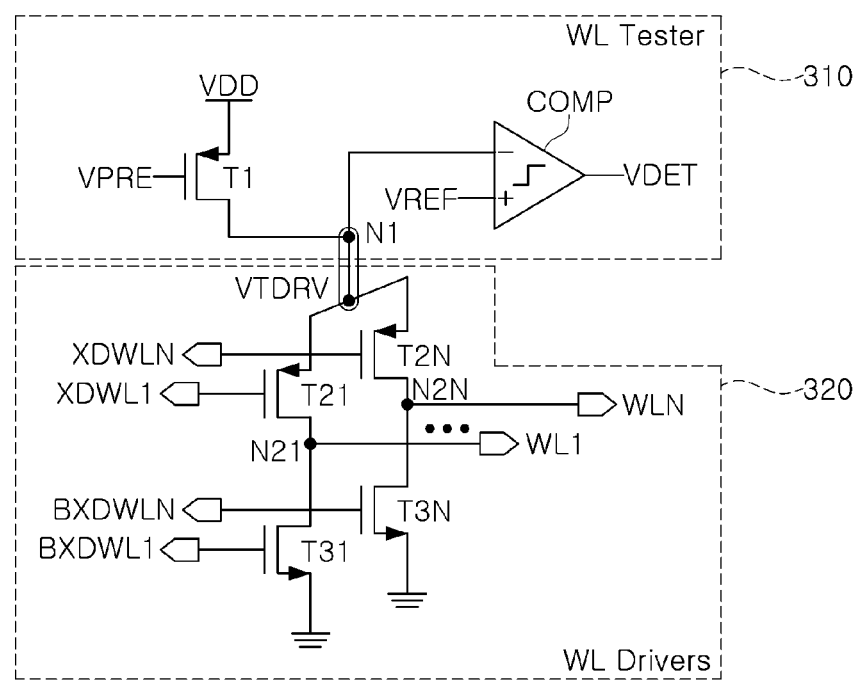
FIG. 3 is a diagram illustrating a structure of a row decoder according to an example embodiment.

FIG. 3 is a diagram illustrating a structure of a row decoder according to an example embodiment.

A row decoder 300 of FIG. 3 may correspond to the row decoder 212 described with reference to FIG. 1.

The row decoder 300 may include a word line tester 310 and a plurality of word line drivers 320.

The word line tester 310 may include a first transistor T1 connected between a power supply voltage level VDD and a first node N1, and a comparator COMP outputting a result of comparing a voltage of the first node N1 with a reference voltage VREF as a detection signal VDET. The first transistor T1 is a P-type transistor, and may be turned on or turned off by a pre-charge signal VPRE. When the first transistor T1 is turned on, a power voltage may be supplied to a plurality of word line drivers 320.

The plurality of word line drivers 320 may drive a plurality of word lines WL1 to WLN. The plurality of word line drivers 320 are connected to the first node N1 and a power ground node in parallel, and each of the plurality of word line drivers 320 may have a plurality of second nodes N21 to N2N connected to a corresponding word line among the plurality of word lines WL1 to WLN. The plurality of word line drivers 320 may include a plurality of second transistors T21 to T2N connected between the first node N1 and the plurality of second nodes N21 to N2N, and a plurality of third transistors T31 to T3N connected between the plurality of second nodes N21 to N2N and a power ground node.

The plurality of second transistors T21 to T2N are P-type transistors and may be controlled by first driving control signals XDWL1 to XDWLN. The first driving control signals XDWL1 to XDWLN may be applied to gates of the plurality of second transistors T21 to T2N. The plurality of third transistors T31 to T3N are N-type transistors, and may be controlled by second driving control signals BXDWL1 to BXDWLN. The second driving control signals BXDWL1 to BXDWLN may be applied to gates of the plurality of third transistors T31 to T3N.

In a state in which the first transistor T1 is turned on, the plurality of second transistors T21 to T2N may activate a plurality of word lines WL1 to WLN, and the plurality of third transistors T31 to T3N may inactivate the plurality of word lines WL1 to WLN. For example, when the first word line WL1 is driven, a logic low signal may be applied to first and second driving control signals XDWL1 and BXDWL1 to turn-on the second transistor T21, and when the third transistor T31 is turned off, the first word line WL1 may be charged with a first node voltage VTDRV. Conversely, when a logic high signal is applied to the first and second driving control signals XDWL1 and BXDWL1, the second transistor T21 may be turned off, and when the third transistor T31 is turned on, the first word line WL1 may be connected to a power ground node to be discharged.

The row decoder 300 according to an example embodiment may perform a defect test of a word line by simultaneously driving the plurality of word lines WL1 to WLN. Hereinafter, a method of the defect test of the word line of the row decoder 300 according to an example embodiment will be described in detail with reference to FIGS. 4 to 5C.

Figure 4:
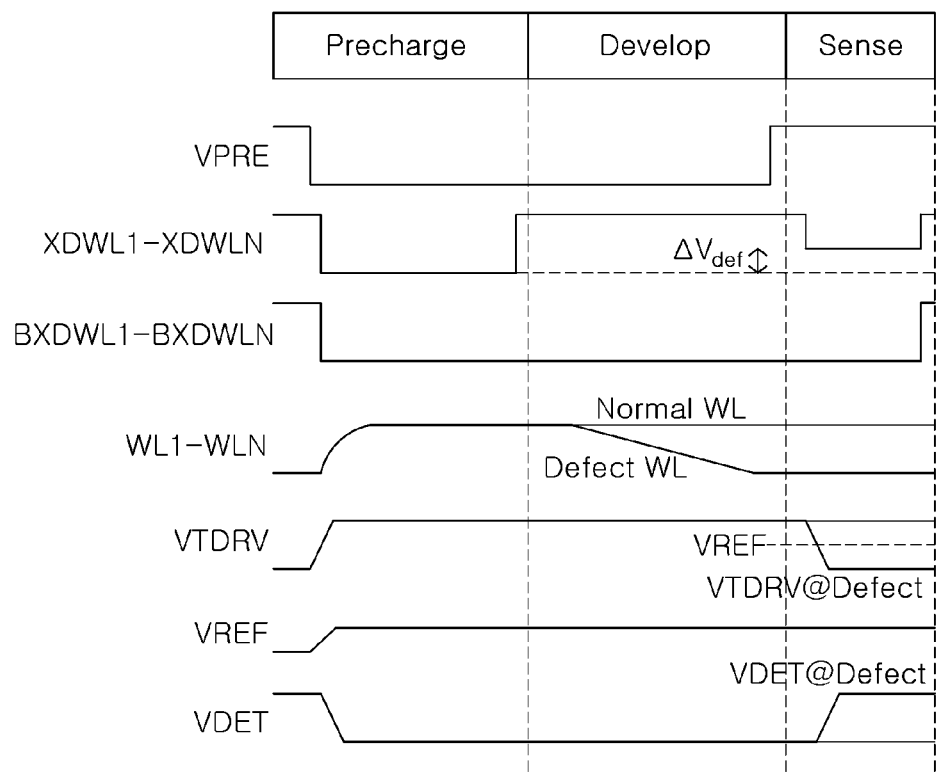
FIG. 4 is a signal diagram of a row decoder according to an example embodiment.
Figure 5A:
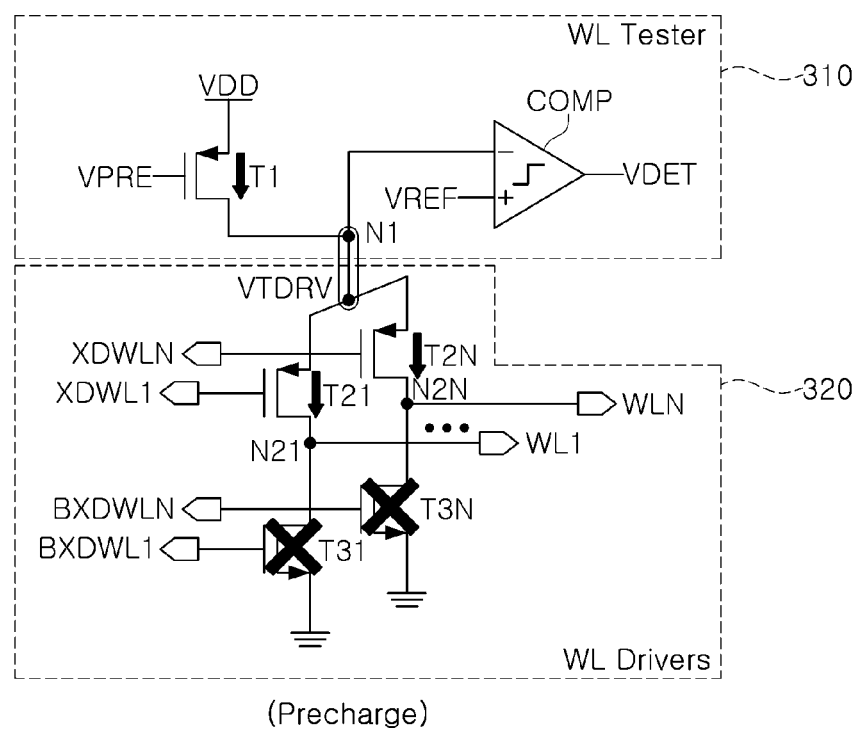
FIGS. 5A, 5B, and 5C are diagrams illustrating an operation of a row decoder according to an example embodiment.
Figure 5B:
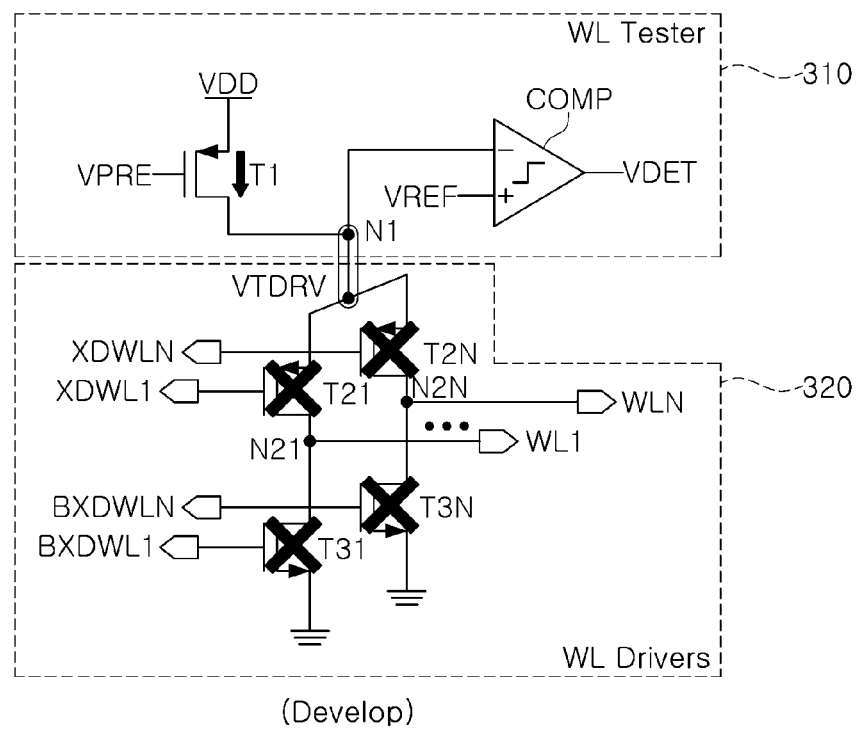
Figure 5C:
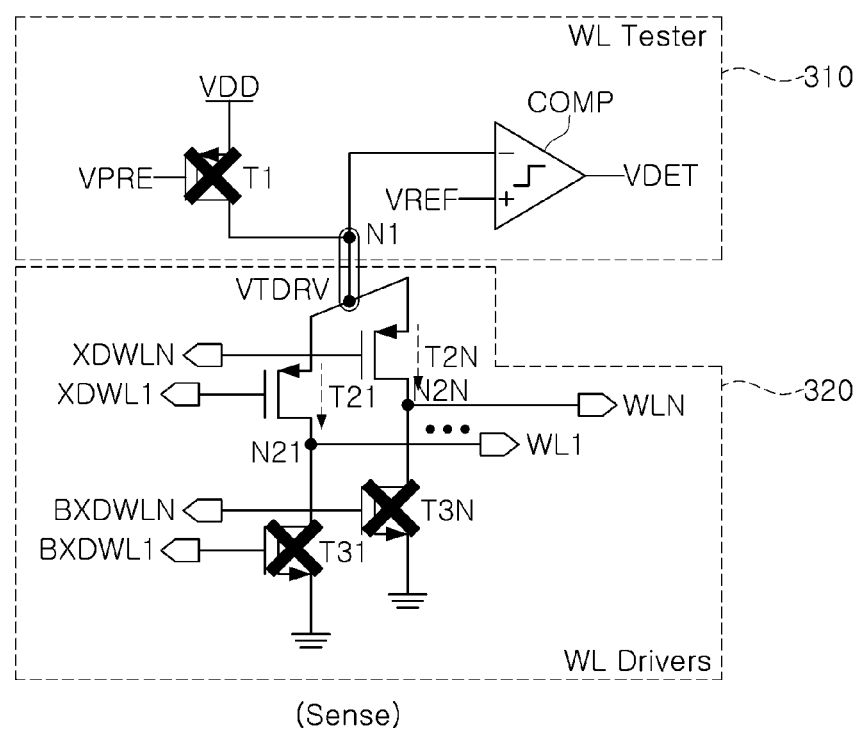

FIG. 4 is a signal diagram of a row decoder according to an example embodiment. FIGS. 5A to 5C are diagrams illustrating an operation of a row decoder according to an example embodiment.

Referring to FIG. 4, the row decoder 300 may perform a defect test of a word line over a pre-charging period, a development period, and a sensing period.

In the pre-charging period, a pre-charge signal VPRE may transition to a logic low state, and all of first driving signals XDWL1 to XDWLN and second driving signals BXDWL1 to BXDWLN may also transition to a logic low state.

Referring to FIGS. 4 and 5A together, a first transistor T1 may be turned on in the pre-charging period, and a first node N1 may be pre-charged with a power supply voltage level VDD. As second transistors T21 to T2N are turned on and third transistors T31 to T3N are turned off, the word lines WL1 to WLN may also be pre-charged with the power supply voltage level VDD.

A reference voltage VREF having a constant level may be applied to a comparator COMP. The reference voltage VREF may have a level lower than the power voltage level VDD and higher than a ground voltage. In the pre-charging period, a detection voltage VDET may have a logic low state according to a comparison result between a first node voltage VTDRV and the reference voltage VREF.

In the development period, the first driving signals XDWL1 to XDWLN may transition from a logic low state to a logic high state. The pre-charge signal VPRE and the second driving signals BXDWL1 to BXDWLN may maintain a logic low state.

Referring to FIGS. 4 and 5B together, since the second transistors T21 to T2N remain turned off and the third transistors T31 to T3N remain turned off, the word lines WL1 to WLN may be floated. Each of the floating word lines WL1-WLN may be discharged at a different rate depending on whether or not there is a defect.

For example, a negligible natural leakage current may occur even in a normal word line. However, a leakage current of several hundred to several thousand times the natural leakage current may occur in a defective word line. Even when a defective word line is completely discharged, and the defective word line has a ground voltage, the normal word line may be maintained close to a power supply voltage level VDD.

Thus, in some embodiments, a first typical discharge rate of a defective word line among the plurality of word lines is faster than a second typical discharge rate due to natural leakage of a normal word line among the plurality of word lines.

A length of a development period may be determined based on a rate at which a defective word line is discharged and a rate at which a normal word line is discharged. For example, the length of the development may be longer than a time for which a voltage of the defective word line is discharged below a predetermined level and shorter than a time for which a voltage of the normal word line is discharged below a predetermined level. A time for which the defective word line and the normal word line are discharged may be determined in consideration of a resistance value, parasitic capacitances, the predetermined level, and the like, of the defective word line and the normal word line. The predetermined level may be arbitrarily selected, for example, a reference voltage (VREF) level may be selected.

Thus, a length of the development period is determined in some embodiments based on a first typical discharge rate of the defective word line and a second typical discharge rate of the normal word line.

In the development period, since the first transistor T1 maintains a turned-on state, the first node voltage VTDRV may maintain a pre-charge state. The detection voltage VDET may also maintain a logic low state.

In the sensing period, the pre-charge signal VPRE may transition from a logic low state to a logic high state. In addition, the first driving signals XDWL1-XDWLN may transition to a logic low state. Referring to FIGS. 4 and 5C, since the first transistor T1 is turned off, the first node voltage VTDRV may be floated. The second transistors T21 to T2N may be turned on. When all of the word lines WL1 to WLN are normal word lines, a voltage difference between the first node N1 and the second nodes N21 to N2N may be close to '0'. Accordingly, little current may flow through each of the second transistors T21 to T2N.

On the other hand, when at least one of the word lines WL1 to WLN is a defective word line, a voltage of a second node connected to the defective word line may be close to a ground level. Accordingly, a voltage difference between the first node N1 and the second node connected to the defective word line may be close to a power supply voltage level VDD, and a current may flow through the second transistor connected to the defective word line.

According to an example embodiment, the first driving signals XDWL1-XDWLN may have a level higher than a signal level thereof in the pre-charging period by a predetermined level ΔVdef. For example, the first driving signals XDWL1 to XDWLN may have a level higher than a ground level by a predetermined level ΔVdef. An upper limit of the predetermined level ΔVdef may be determined according to [Equation 1] below $$(Vs - \Delta Vdef) - Vth > 0 \qquad \text{[Equation 1]}$$

wherein Vs may be a voltage of the first node, and Vth may be a threshold voltage of the second transistors.

When the first driving signals XDWL1 to XDWLN have a level as high as the predetermined level ΔVdef, a channel between sources and drains of the second transistors T21 to T2N may be weakly formed. Even when the channel therebetween is weakly formed, current may smoothly flow through the second transistor if the voltage difference between the first node N1 and the second nodes N21 to N2N is at a level of a power supply. On the other hand, when the voltage difference between the first node N1 and the second nodes N21 to N2N is close to '0', leakage of current of the second transistor may be strongly blocked. As a result, a current difference between a case in which there is a defective word line among the word lines WL1 to WLN and a case in which there is no defective word line may be amplified.

When all of the word lines WL1 to WLN are normal word lines, little current flows to the second nodes N21 to N2N, so a first node voltage VTDRV may be maintained at the power supply voltage level VDD. According to a comparison result between the first node voltage VTDRV and the reference voltage VREF, the detection voltage VDET may be maintained in a logic low state.

On the other hand, when at least one defective word line is included among the word lines WL1 to WLN, the first node voltage VTDRV may be discharged to a ground level, and the detection voltage VDET may transition to a logic high state according to the comparison result between the first node voltage VTDRV and the reference voltage VREF. For a typical fabrication process, the normal word line current in the develop phase is less than 10 pA (pico Amp). This may be referred to as typical for a normal word line. For the develop phase, a typical word line current in a defective word line is greater than 10 nA (nano Amp). This may be referred to as typical for a defective word line.

The level of the reference voltage VREF may be variously selected between the power supply voltage level VDD and a ground voltage according to implementation. For example, as a level of the reference voltage VREF is higher, the discharged first node voltage VTDRV may be detected quickly, and a sensing time may be shortened. On the other hand, the lower the level of the reference voltage VREF, the longer the sensing time may be, but the accuracy of the defect test may be improved.

The row decoder 300 may output the detection voltage VDET externally, and an external circuit such as the control circuit 220 described with reference to FIG. 1 determines whether the word lines WL1 to WLN include a defective word line based on the detection voltage VDET output from the row decoder 300.

According to an example embodiment described with reference to FIGS. 4 to 5C, the row decoder 300 may perform a defect test on all the word lines WL1 to WLN and determine whether there is a defective word line among word lines WL1 to WLN. There is a case in which the memory device needs to detect which word line among the word lines WL1 to WLN is a defective word line.

According to an example embodiment, the row decoder 300 may perform a defect test only on target word lines among word lines WL1 to WLN by adjusting a range of target word lines to be inspected for defects. The row decoder 300 may detect a defective word line by repeatedly performing a defect test while narrowing a range of the target word lines based on a control of the control circuit 220. Hereinafter, a method in which a memory device detects a defective word line according to an example embodiment will be described in detail with reference to FIGS. 6 to 11.

Figure 6:
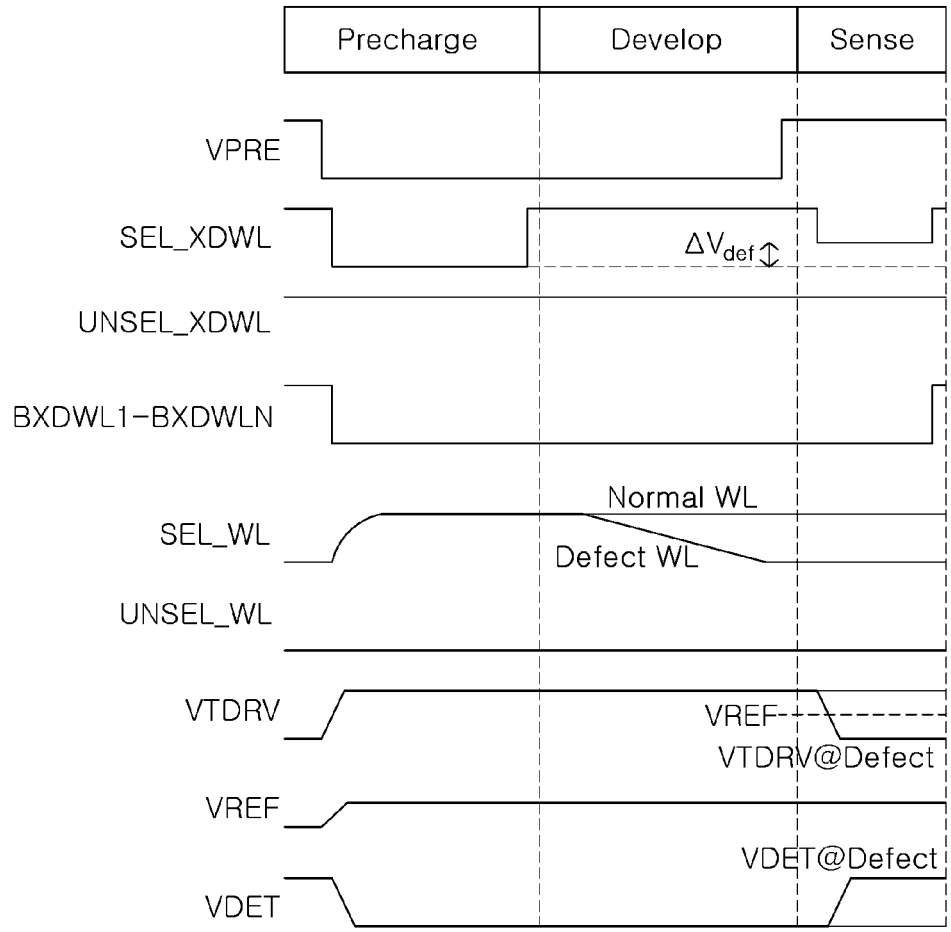
FIG. 6 is a signal diagram of a row decoder according to an example embodiment.

FIG. 6 is a signal diagram of a row decoder according to an example embodiment.

Referring to FIG. 6, as described with reference to FIG. 4, a row decoder 300 may perform a defect test on a word line over a pre-charging period, a development period, and a sensing period. Hereinafter, a method of performing a defect test on a word line according to an example embodiment will be described with a focus on a difference from the method of a defect test of a word line.

According to an example embodiment, the row decoder 300 may perform a defect test only on selected word lines SEL_WL among the word lines WL1 to WLN. That is, it may be tested whether a defective word line is included among the selected word lines SEL_WL.

A selected driving control signal SEL_XDWL may be applied to a second transistor connected to the selected word lines SEL_WL. The selected driving control signal SEL_XDWL may be the same as the first control signals XDWL1 to XDWLN described with reference to FIG. 4 in the pre-charging period, the development period, and the sensing period. The selected word lines SEL_WL may be driven in the same manner as the word lines WL1 to WLN described with reference to FIG. 4 in response to the selected driving control signal SEL_XDWL.

On the other hand, an unselected driving control signal UNSEL_XDWL may be applied to a second transistor connected to unselected word lines UNSEL_WL. The unselected driving control signal SEL_XDWL may maintain a logic high state in the pre-charging period, the development period, and the sensing period. The unselected word lines UNSEL_WL may be floated in all periods for performing the defect test and may not be electrically connected to the first node N1.

As a result, a first node voltage VTDRV may be selectively discharged depending on whether the defective word line is included in the selected word lines SEL_WL regardless of whether the unselected word lines UNSEL_WL are defective. A detection signal VDET may indicate whether a defective word line is included in the selected word lines SEL_WL.

According to an example embodiment, the memory device 200 may detect a defective word line from among the word lines WL1 to WLN while narrowing a range of the target word line.

Figure 7:
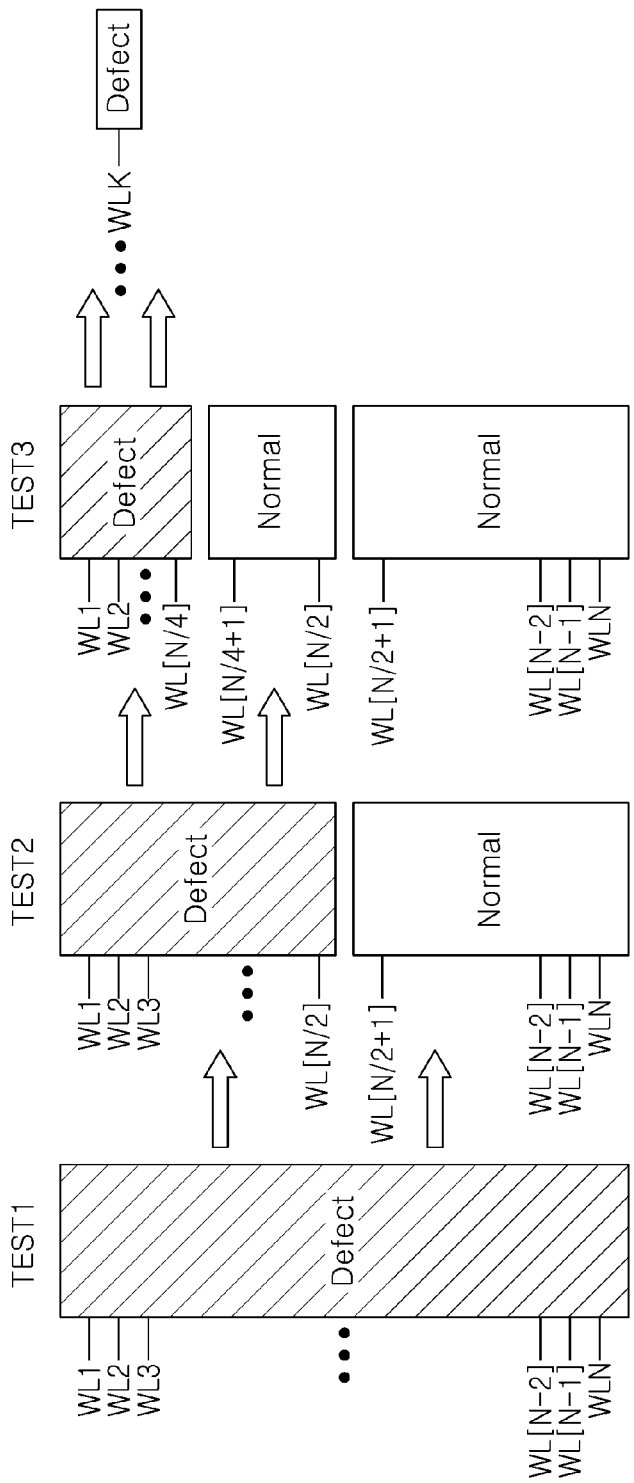
FIGS. 7 and 8 are diagrams illustrating an operation of a memory device according to an example embodiment.
Figure 8:
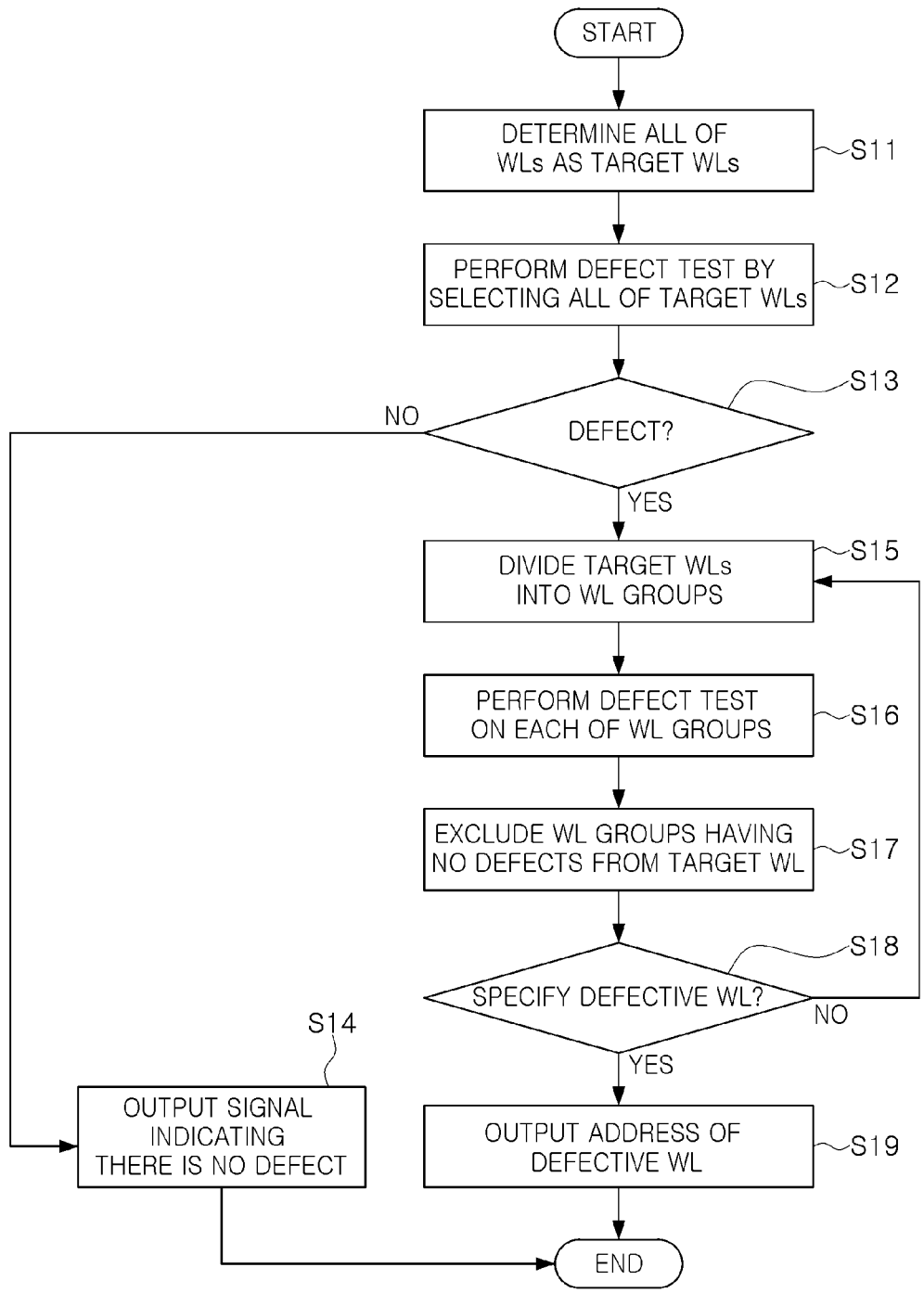

FIGS. 7 to 8 are diagrams illustrating an operation of a memory device according to an example embodiment.

FIG. 7 is a diagram illustrating a process of detecting a defective word line WLK by performing a plurality of defect tests TEST1, TEST2, TEST3, . . . while narrowing a range of target word lines. FIG. 8 is a flowchart illustrating a method for a memory device to detect a defective word line.

Referring to FIG. 7, a first defect test TEST1 may be performed on all word lines WL1 to WLN included in the memory device 200. If it is determined that there are no defects in all word lines WL1 to WLN as a result of performing the first defect test TEST1, the detection of the defective word line may be terminated. On the other hand, if it is determined that the defective word line is included in the word lines WL1 to WLN, an additional defect test may be performed.

The word lines WL1 to WLN may be divided into first groups WL1 to WL[N/2] and second groups WL[N/2+1]-WLN. Each of the first groups WL1 to WL[N/2] and the second groups WL[N/2+1]-WLN may have half the total number of word lines. The second defect test TEST2 may be performed on each of the first groups WL1 to WL[N/2] and the second groups WL[N/2+1] to WLN.

In an example of FIG. 7, it may be determined that a defective word line is included in the first groups WL1 to WL[N/2], and it may be determined that there is no defective word line in the second groups WL[N/2+1] to WLN. The second groups WL[N/2+1] to WLN may be excluded from a target word line of the defect test, and the first groups WL1 to WL[N/2] may be divided into first sub groups WL1 to WL[N/4] and second sub groups WL[N/4+1] to WL[N/2]. The third defect test TEST3 may be performed for each of the first subgroups WL1 to WL[N/4] and the second subgroups WL[N/4+1] to WL[N/2].

As a result of the third defect test TEST3, it is determined that there is no defective word line in the first subgroups WL1 to WL[N/4], and there is no defective word line in the second subgroups WL[N/4+1] to WL, the first sub-groups WL1 to WL[N/4] may divided into two groups again, and a defect test may be performed. The defect test may be repeatedly performed until an address of the defective word line WLK is specified. When the address of the defective word line WLK is specified, the detection of the defective word line may be completed.

Referring to FIG. 8, detection of a defective word line according to an example embodiment may start from step S11.

In step S11, all of the word lines WL1 to WLN may be selected as target word lines, and in step S12, all of the target word lines may be selected to perform a defect test. For example, the control circuit 220 may control the row decoder 300 to perform a defect test on all of the word lines WL1 to WLN.

As a result of performing the defect test, it may be determined whether a defective word line is included among the word lines selected in step S13.

When there is no defective word line among the selected word lines ("No" in step S13), a signal indicating that there is no defect may be output in step S14, and the detection of the defective word line may be terminated. For example, the control circuit 220 may output a signal indicating no defect externally of the memory device 200 in response to the detection signal VDEF having a logic low level received from the row decoder 300.

When a defective word line is included among the selected word lines ("YES" in step S13), target word lines may be divided into word line groups in step S15. Then, in step S16, a defect test may be performed on each of the word line groups. For example, the control circuit 220 may control the row decoder 300 to divide the target word lines into two word line groups by half, and perform a defect test on each of the word line groups.

Word line groups determined to have no defective word lines among the word line groups as a result of the defect test may be excluded from the target word line in step S17.

In step S18, it may be determined whether a defective word line has been specified.

When the defective word line is not specified ("No" in step S18), steps S15 to S18 may be repeatedly performed for target word lines.

When the defective word line is specified ("Yes" in step S18), an address of the defective word line specified in step S19 may be output, and the detection of the defective word line detection may be terminated. For example, the control circuit 220 may output the address of the defective word line to externally of the memory device 200.

In the semiconductor device 200, a defective word line may occur very rarely. According to the implementation, a probability that two or more defective word lines are included in the semiconductor device 200 may be ignored. According to an example embodiment, a binary search technique may be used to detect one defective word line.

Figure 9:
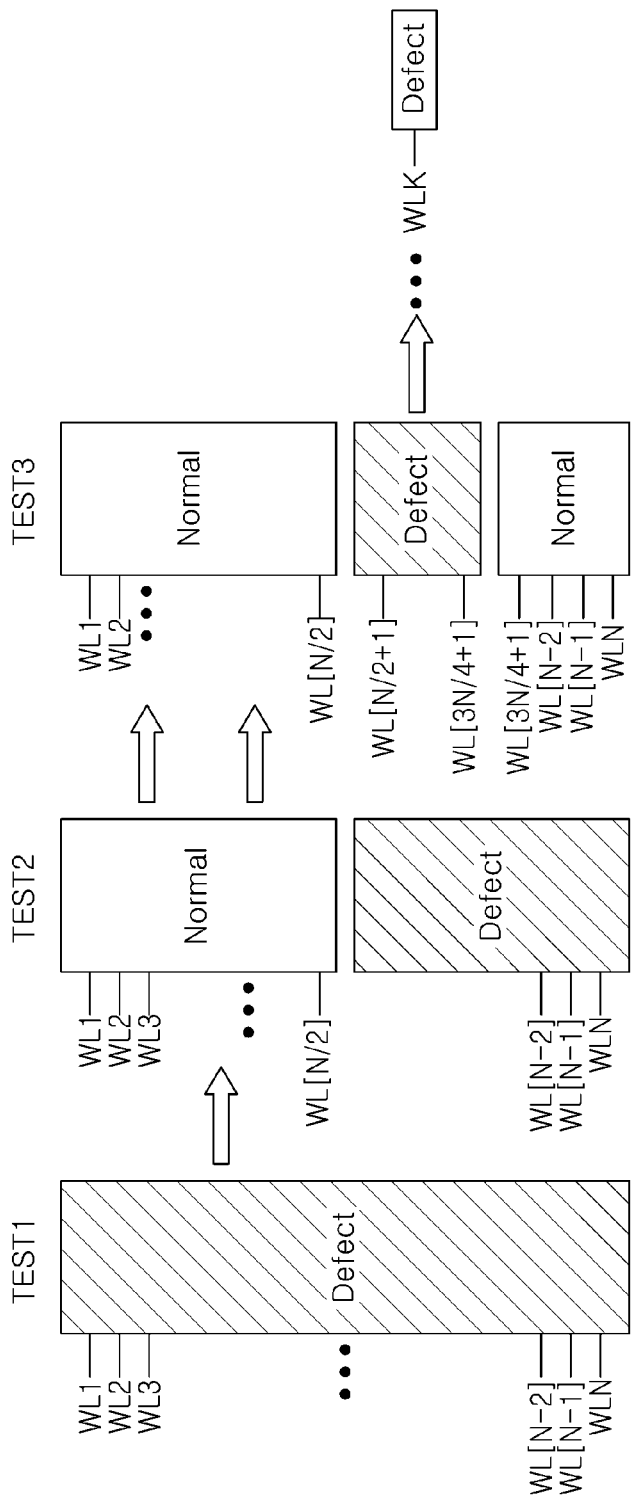
FIGS. 9 and 10 are diagrams illustrating an operation of a memory device according to an example embodiment.
Figure 10:
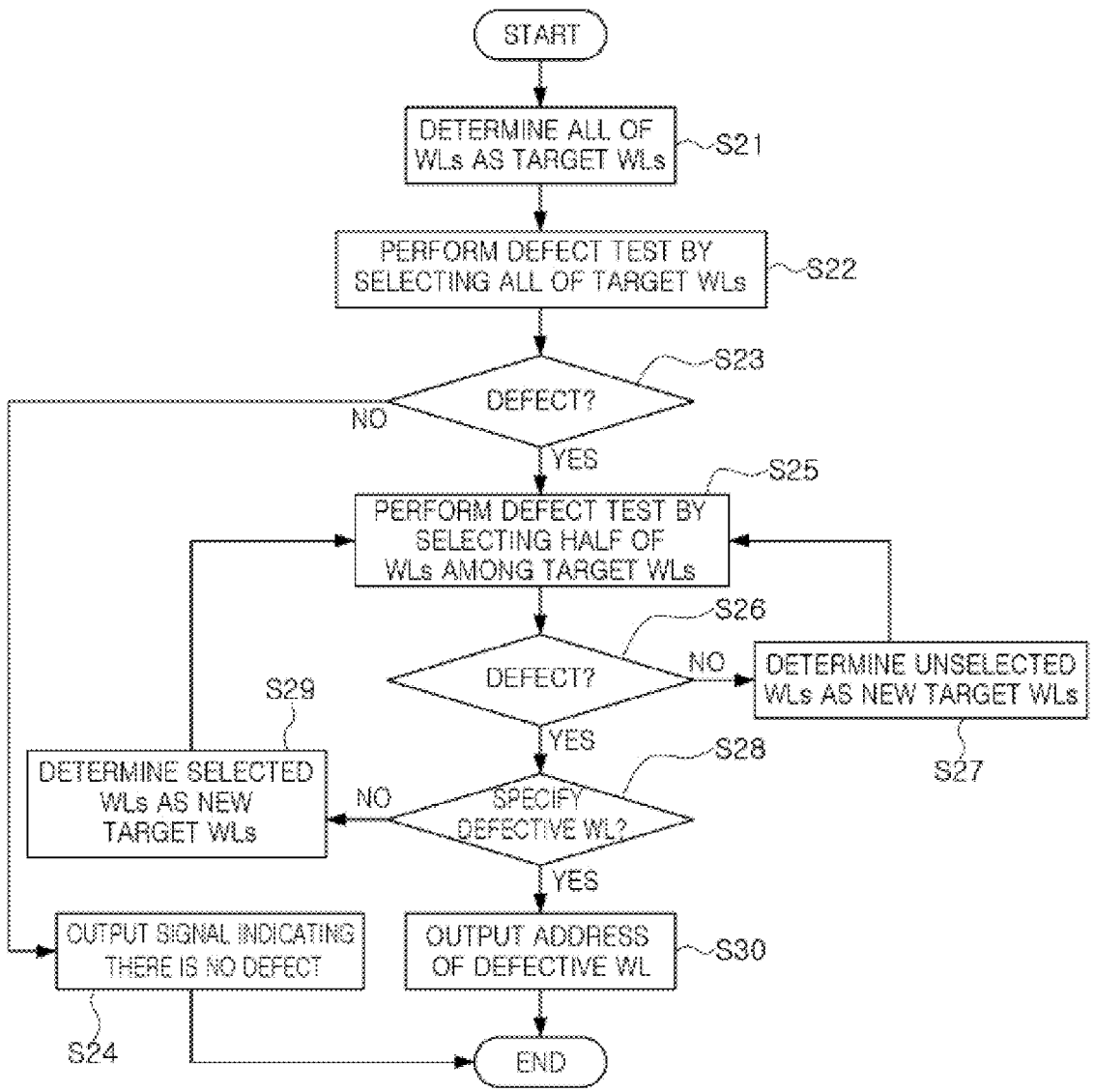

FIGS. 9 to 10 are diagrams illustrating an operation of a memory device according to an example embodiment.

FIG. 9 is a diagram illustrating a process of detecting a defective word line WLK by performing a plurality of defect tests (TEST1, TEST2, TEST3, . . . ) based on a binary search. FIG. 10 is a flowchart illustrating a method for a memory device to detect a defective word line.

Referring to FIG. 9, a first defect test TEST1 may be performed on all word lines WL1 to WLN included in the memory device 200. If it is determined that there are no defects in all word lines WL1 to WLN as a result of the first defect test TEST1, detection of a defective word line may be terminated. On the other hand, if it is determined that the defective word line is included in the word lines WL1 to WLN, an additional defect test may be performed.

The word lines WL1 to WLN may be divided into first groups WL1 to WL[N/2] and second groups WL[N/2+1] to WLN. A second defect test TEST2 may be performed on the first groups WL1-WL[N/2]. In an example of FIG. 9, it may be determined that there is no defective word line in the first groups WL1 to WL[N/2]. According to an example embodiment, it may be determined that the second groups (WL[N/2+1]-WLN) includes a defective word line without a defect test on the second groups (WL[N/2+1]-WLN).

The second groups WL[N/2+1] to WLN may be divided into first subgroups WL[N/2+1]-WL[3N/4] and second subgroups WL[3N/4+1]-WLN. A third defect test TEST3 may be performed on the first subgroups WL[N/2+1] to WL[3N/4]. In an example of FIG. 10, it may be determined that a defective word line is included in the first subgroups WL[N/2+1] to WL[3N/4]. According to an example embodiment, it may be determined that the second subgroups WL[3N/4+1] to WLN do not include a defective word line without performing a defect test on the second subgroups WL[3N/4+1] to WLN. The first subgroups WL[N/2+1] to WL[3N/4] may be divided into two groups again, and a defect test may be performed on one group of the two groups. The defect test may be repeatedly performed until an address of the defective word line WLk is specified. When the address of the defective word line WLk is specified, the detection of the defective word line may be completed.

Referring to FIG. 10, detection of a defective word line according to an example embodiment may start from step S21. Steps S21, S22, S23 and S24 may be the same as steps S11 to S14 of FIG. 8.

When a defective word line is included among target word lines ("YES" in step S23), half of the word lines among target word lines may be selected in step S25 to perform a defect test. Then, it may be determined whether the defective word line is included in the word lines selected in step S26.

If there is no defective word line in the selected word lines ("No" in step S26), unselected word lines among the target word lines may be determined as new target word lines in step S27, and step S25 may be repeatedly performed on the new target word lines.

If there is a defective word line in the selected word lines ("YES" in step S26), it may be determined whether a defective word line is specified in step S28.

When a defective word line is not specified ("No" in step S28), the selected word lines are determined as new target word lines in step S29, and step S25 may be repeatedly performed on the new target word lines.

When a defective word line is specified ("YES" in step S28), an address of the specified defective word line can be output in step S30.

According to an example embodiment, since a defect test can be performed on a plurality of word lines at once, a defective word line may be detected while narrowing a range of target word lines using a binary search technique. Accordingly, the number of repetitions of the defect test to detect a defective word line may be reduced. Specifically, time complexity of the binary search technique is O(log n), which may be lower than time complexity of a linear search technique O(n). Accordingly, according to an example embodiment, a time required to detect the defective word line is greatly reduced, compared to a time required to detect the defective word line by sequentially performing the defect test on each of the plurality of word lines.

As described with reference to FIGS. 7 to 10, a defective word line may be detected while narrowing a range of the target word lines from all of the word lines WL1-WLN included in the memory device 200. However, embodiments are not limited thereto. For example, a defective word line may be detected by dividing the word lines WL1 to WLN into a plurality of groups, and performing a binary search on each of the plurality of groups. When the binary search is performed on all of the word lines WL1 to WLN, the number of repetitions of the defect test may be reduced, and when the binary search is performed on each of a plurality of groups, a load for driving the word lines may decrease.

An example embodiment has been described taking a case in which the memory device 200 includes one memory region 210 in FIGS. 1 to 10 as an example. However, embodiments are not limited thereto. For example, the embodiments may be applied to a memory device including a plurality of memory cell arrays, or to a memory system including a plurality of memory devices. Hereinafter, a memory device and a memory system to which the embodiments can be applied will be described with reference to FIGS. 11 to 12.

Figure 11:
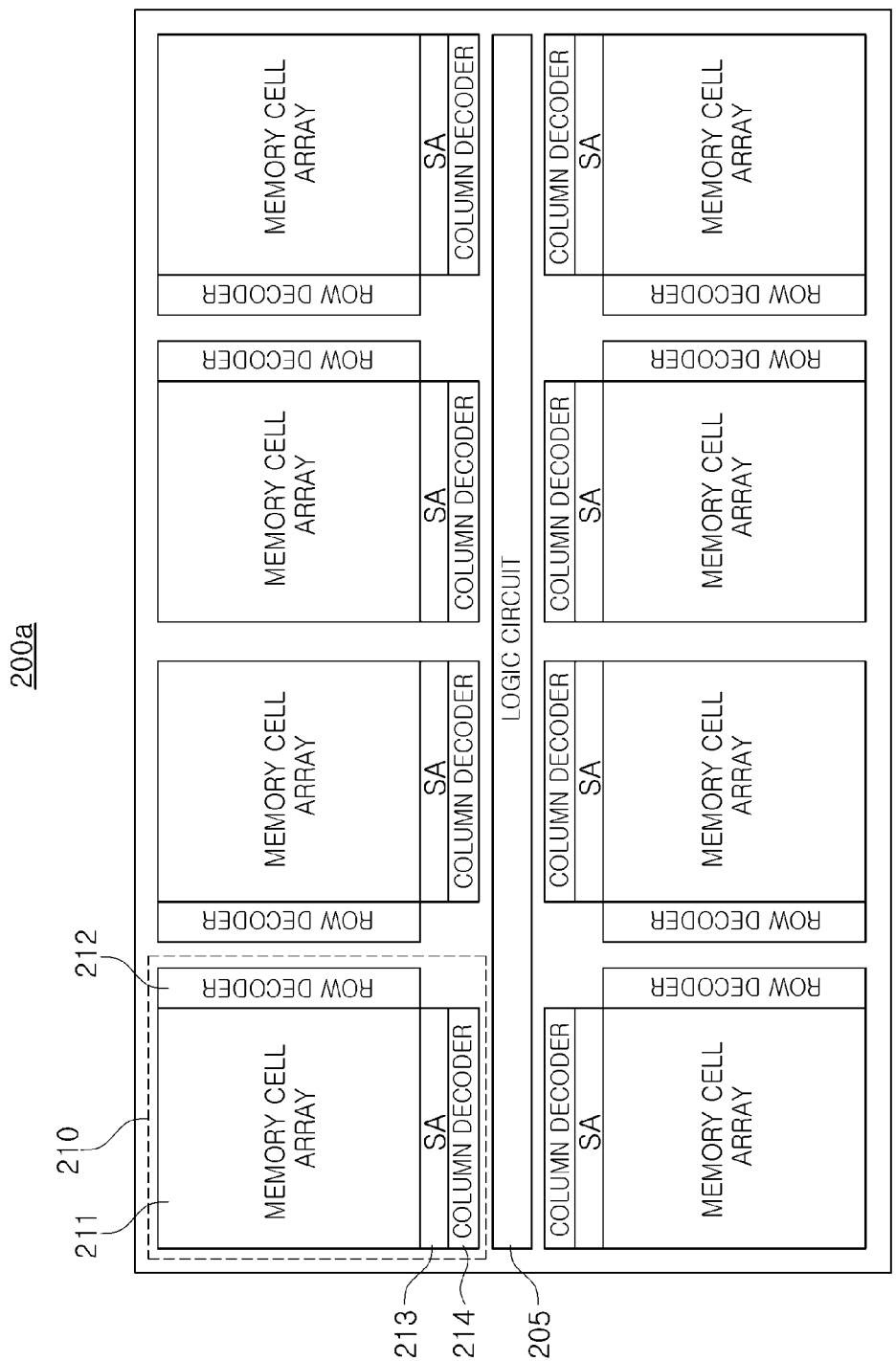
FIG. 11 is a diagram illustrating a structure of a memory device.

FIG. 11 is a diagram illustrating a structure of a memory device.

Referring to FIG. 11, a memory device 200a may include a plurality of unit memory regions 210. For example, when the memory device 200a is a dynamic random access memory (DRAM), the unit memory region 210 may be defined as a memory bank. Each of the plurality of unit memory regions 210 may include a memory cell array 211, a row decoder 212, a sense amplifier circuit 213, a column decoder 214, and the like.

An operation of the semiconductor device 200a may be controlled by a logic circuit 205. The logic circuit 205 stores data received from an outside in at least one of the plurality of unit memory regions 210, read data from at least one of the plurality of unit memory regions 210 based on address information received from the outside and output the same externally.

In addition, the logic circuit 205 may include an input/output circuit for sending and receiving signals to and from an external device. Since the plurality of unit memory regions 210 are disposed on both sides of the logic circuit 205, the logic circuit 205 may be disposed in a center region of the semiconductor device 200.

According to an example embodiment, a row decoder 212 included in each of the plurality of unit memory regions 210 may include a plurality of word line drivers connected to each other in parallel, and may include a first transistor supplying a power supply voltage level VDD to the plurality of word line drivers. The row decoder 212 may pre-charge a plurality of word lines at once by turning-on the first transistor, and develop the plurality of word lines at once by turning-off the plurality of word line drivers while the first transistor is turned on. The row decoder 212 may check whether there is a defective word line among the plurality of word lines by turning-off the first transistor and turning-on the plurality of word line drivers.

According to an example embodiment, the logic circuit 205 may detect a defective word line for each of the unit memory regions 210. The logic circuit 205 may control the unit memory regions 210 to repeat a defect test while narrowing a range of target word lines to detect a defective word line of the unit memory regions 210. The logic circuit 205 may determine a defective word line of the unit memory regions 210 based on a result of the defect test from the unit memory regions 210.

The logic circuit 205 may control repair of the unit memory region 210 in which the defective word line is determined. For example, the logic circuit 205 may mask an address of the defective word line of the unit memory region 210, and replace the word line so that an address of the redundancy word line is accessed instead of the address of the defective word line.

Figure 12:
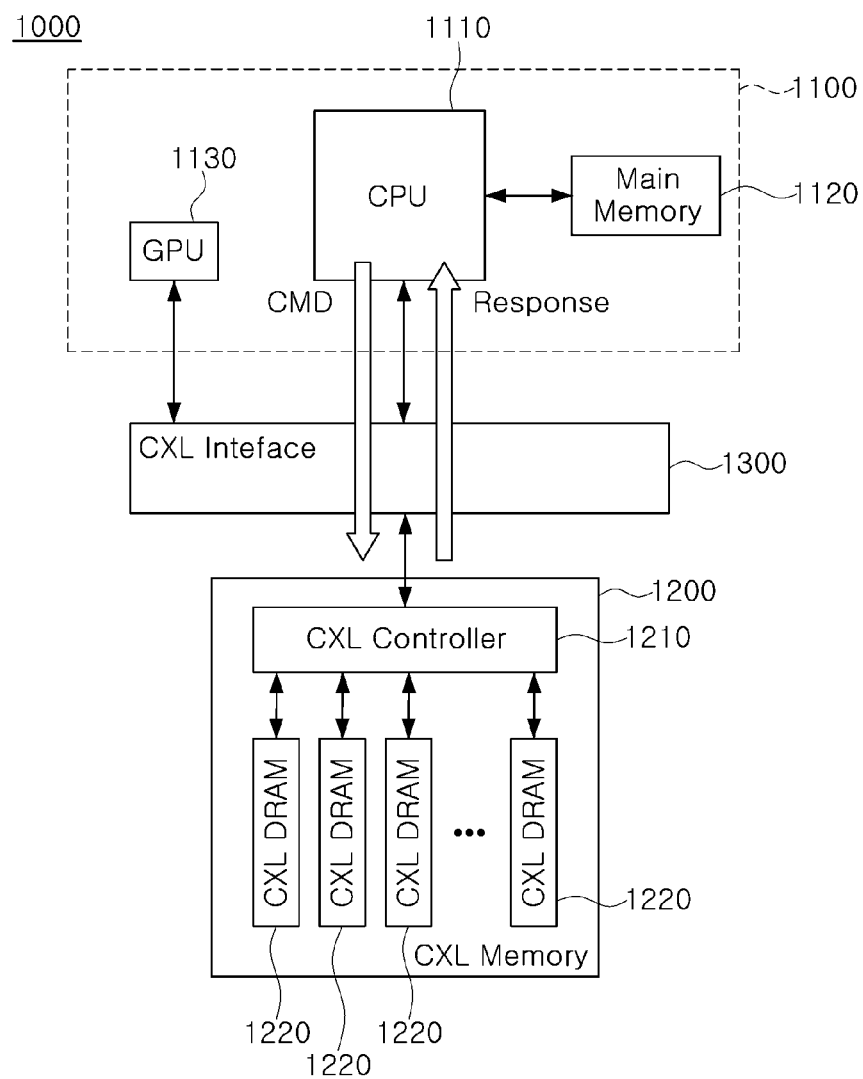
FIG. 12 is a diagram illustrating a system including memory devices according to an example embodiment.

FIG. 12 is a diagram illustrating an electronic system including a memory system according to an example embodiment.

An electronic system 1000 may include a host system 1100, an extended memory system 1200, and an interface 1300.

The host system 1100 may include a CPU 1110 and a main memory 1120, and may further include a heterogeneous computing device such as a GPU 1130. The CPU 1110 may process data loaded into the main memory 1120. If the CPU 1110 must load data into the main memory 1120 in order to process the data in a system in which a large amount of data is processed, such as a data center, a bottleneck phenomenon due to data transmission may occur. In addition, even when data is processed by heterogeneous computing devices, such as the CPU 1110, the GPU 1130, and the like, a bottleneck phenomenon may occur due to data movement between memories of the heterogeneous computing devices.

The electronic system 1000 may include an extended memory system 1200 that can be directly accessed by the CPU 1110, the GPU 1130, and the like, so that high-speed and high-capacitance data processing between heterogeneous computing devices may be performed. The electronic system 1000 may include an interface 1300 allowing the CPU 1110, the GPU 1130, and the like to access the extended memory system 1200. For example, the interface 1300 may support a Compute Express Link (CXL) protocol based on a Peripheral Component Interconnect Express (PCIe) protocol.

The extended memory system 1200 may include an extended controller 1210 and a plurality of memory devices 1220. The extended memory system 1200 may further include a buffer memory that can be directly accessed by a host system 1100. The plurality of memory devices 1220 may support a high capacitance extended memory system 1200, and the buffer memory may support a high bandwidth extended memory system 1200.

In order to implement the extended memory system 1200 supporting high capacitance at low cost, memory devices 1220 of which quality is not sufficiently verified in a semiconductor process may be used in the extended memory system 1200. For example, in a semiconductor process, electrical characteristics of memory devices may be inspected, and memory devices that fall somewhat short of a predetermined inspection standard are used in the extended memory system 1200.

The extended memory system 1200 may be assembled in a form of a memory card. Defective word lines may be included in the memory devices 1220 included in the assembled extended memory system 1200. In order for the extended memory system 1200 to be used normally, defective word lines are detected in the memory devices 1220 even after the extended memory system 1200 is assembled into a finished product, and it is required that the memory devices 1220 may be repaired.

According to an example embodiment, the extended memory system 1200 may detect a defective word line of memory devices 1220 in response to a command signal from the CPU 1110, and repair the memory devices 1220.

Each of the memory devices 1220 may include a row decoder 300 as described with reference to FIG. 3. The row decoder 300 may simultaneously perform a defect test on a plurality of word lines connected to the row decoder 300. The extended controller 1210 may specify an address of a defective word line included in the memory devices 1220 by controlling the defect test of the memory devices 1220. The extended controller 1210 may provide the specified address of the defective word line to the CPU 1110 in response to a command signal.

When the CPU 1110 obtains information on the address of the defective word line, the CPU 1110 may request the extended memory system 1200 to repair the memory device 1220 including the defective word line. The extended memory system 1200 may replace the defective word line of the memory device 1220 with a redundancy word line in response to a control signal including the request, and may provide a completion response to the CPU 1110.

Each of the memory devices 1220 may simultaneously perform a defect test on a plurality of word lines, and detection of the defective word line may be performed on each of the memory devices 1220 in parallel. According to an example embodiment, the detection of the defective word line may be quickly performed for the extended memory system 1200 including a plurality of memory devices 1220. In addition, even after the extended memory system 1200 is assembled into a finished product, the defective word line detection may be performed, and further, the memory devices 1220 may be repaired.

As set forth above, according to an example embodiment, a row decoder circuit may simultaneously perform a defect test on a plurality of word lines included in the memory device.

According to an example embodiment, the memory device may quickly detect a defective word line by using a defect test method on a plurality of word lines.

According to an example embodiment, the memory system may detect a defective word line in a product in a finished state, and repair the defective word line.

The problems to be solved by the present disclosure are not limited to the problems mentioned above, and other problems not mentioned will be clearly understood by those skilled in the art from the following description.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present disclosure as defined by the appended claims.

What is claimed is:

1. In a row decoder circuit controlling a plurality of word lines, the row decoder circuit comprising:
    a power supply node;
    a first node;
    a first transistor connected to the power supply node and the first node;
    a plurality of second nodes connected in parallel between the first node and a power ground node, each of the plurality of second nodes being connected to a respective corresponding word line among the plurality of word lines;
    a plurality of second transistors connected between the first node and the plurality of second nodes;
    a plurality of third transistors connected between the plurality of second nodes and the power ground node; and
    a comparator configured to output a detection signal based on a first voltage of the first node and a reference voltage,
    wherein, in a pre-charging period, the first transistor is turned on, the plurality of second transistors are turned on, and the plurality of third transistors are turned off, so that the first node and the plurality of second nodes are charged,
    in a development period, the first transistor maintains a turned-on state, the plurality of second transistors are turned off, and each of the plurality of second nodes is discharged at a different rate depending on whether a current of a first respective corresponding word line is leaked,
    in a sensing period, the first transistor is turned off, the plurality of second transistors are turned on, and the first node is selectively discharged according to a second voltage level of the plurality of second nodes connected in parallel, and
    a first discharge rate of a defective word line among the plurality of word lines is faster than a second discharge rate of a non-defective word line among the plurality of word lines.

2. The row decoder circuit of claim 1, wherein, in the sensing period, a third voltage level having a higher level than a fourth voltage level of the power ground node is applied to gates of the plurality of second transistors.

3. The row decoder circuit of claim 2, wherein an upper limit of the third voltage level applied to the gates of the plurality of second transistors is determined based on (Vs−ΔVdef)−Vth>0,
    where Vs is a voltage of the first node, ΔVdef is an applied voltage applied to the gates of the plurality of second transistors, and Vth is a threshold voltage of the plurality of second transistors.

4. The row decoder circuit of claim 1, wherein a first level of a first input voltage input to gates of the plurality of second transistors in the sensing period is higher than a second level of a second input voltage input to the gates of the plurality of second transistors in the pre-charging period.

5. The row decoder circuit of claim 1, wherein a length of the development period is determined based on the first discharge rate and the second discharge rate.

6. The row decoder circuit of claim 5, wherein the length of the development period is longer than a first time it takes for the defective word line to be discharged so that a voltage of a second node, among the plurality of second nodes, connected to the defective word line becomes less than or equal to the reference voltage, and
wherein the length of the development period is shorter than a second time it takes for the non-defective word line to be discharged so that a voltage of a second node, among the plurality of second nodes, connected to the non-defective word line becomes less than or equal to the reference voltage.

7. The row decoder circuit of claim 1, wherein a first voltage level of the reference voltage is less than a second voltage level of the power supply node, and is greater than a ground voltage level of the power ground node.

8. The row decoder circuit of claim 7, wherein, as the first voltage level of the reference voltage decreases, a length of the sensing period increases.

9. The row decoder circuit of claim 1, wherein the first transistor and the plurality of second transistors are P-type transistors, and
the plurality of third transistors are N-type transistors.

10. In a row decoder circuit controlling a plurality of word lines, the row decoder circuit comprising:
a power supply node;
a first node;
a first transistor connected to the power supply node and the first node;
a plurality of second nodes connected in parallel between the first node and a power ground node, each of the plurality of second nodes being connected to a respective corresponding word line among the plurality of word lines;
a plurality of second transistors connected between the first node and the plurality of second nodes; and
a plurality of third transistors connected between the plurality of second nodes and the power ground node,
wherein, in a pre-charging period, the first transistor is turned on, the plurality of second transistors are turned on, and the plurality of third transistors are turned off,
in a development period, the first transistor maintains a turned-on state, the plurality of second transistors are turned off,
in a sensing period, the first transistor is turned off, the plurality of second transistors are turned on, and
in the sensing period, the first node has a first voltage level based on there being a defective word line among the plurality of word lines, and the first node has a second voltage level higher than the first voltage level based on there being no defective word line among the plurality of word lines.

11. The row decoder circuit of claim 10, further comprising:
a comparator configured to output a detection signal by comparing a voltage level of the first node and a reference voltage level.

12. The row decoder circuit of claim 10, wherein a first level of a first input voltage input to gates of the plurality of second transistors in the sensing period is higher than a second level of a second input voltage input to the gates of the plurality of second transistors in the pre-charging period.

13. The row decoder circuit of claim 10, wherein a length of the development period is determined based on a first discharge rate and a second discharge rate,
the first discharge rate is the first discharge rate of the defective word line among the plurality of word lines, and
the second discharge rate is the second discharge rate of a non-defective word line among the plurality of word lines.

14. The row decoder circuit of claim 10, wherein, as a third voltage level of a reference voltage decreases, a length of the sensing period increases.

15. A memory device comprising:
a memory cell array comprising a plurality of memory cells;
a plurality of word lines connected to the memory cell array;
a row decoder comprising a first transistor connected to a power supply node and a first node, and a plurality of word line drivers connected in parallel between the first node and a power ground node and configured to drive the plurality of word lines, and a comparator configured to output a detection signal based on a first voltage of the first node and a reference node; and
a control circuit configured to perform a defect test on at least one selected word line, by:
turning on the first transistor, and pre-charging at least one selected word line among the plurality of word lines, in a pre-charging period,
maintaining the first transistor a turn-on state, and floating the at least one selected word line, in a development period, and
turning off the first transistor, electrically connecting the first node and the at least one selected word line, obtaining the detection signal, and determining whether there is a defective word line among the at least one selected word line based on the detection signal, in a sensing period.

16. The memory device of claim 15, wherein the control circuit is further configured to detect the defective word line by repeatedly performing the defect test while changing a range of the at least one selected word line among the plurality of word lines.

17. The memory device of claim 15, wherein the control circuit is further configured to change a range of the at least one selected word line based on a binary search technique.

18. The memory device of claim 15, wherein the control circuit is further configured to, based on determining that the defective word line is included in the at least one selected word line, perform an operation of dividing the at least one selected word line into word line groups, and perform the defect test on each of the word line groups as the defect test is repeatedly performed until an address of the defective word line is specified.

19. The memory device of claim 15, wherein the control circuit is further configured to detect the defective word line by dividing the plurality of word lines into a plurality of word line groups, and performing a binary search on each of the plurality of word line groups.

20. The memory device of claim 15, wherein the control circuit is further configured to turn off at least one unselected word line driver connected to at least one unselected word line among the plurality of word lines during a period in which the defect test is performed.

* * * * *